(12) United States Patent
Shin

(10) Patent No.: US 6,384,464 B1
(45) Date of Patent: May 7, 2002

(54) INTEGRATED CIRCUIT DEVICE INCLUDING DUMMY PATTERNS SURROUNDING PADS

(75) Inventor: Heon-jong Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/512,537

(22) Filed: Feb. 24, 2000

(30) Foreign Application Priority Data

Mar. 16, 1999 (KR) .................................. 8765

(51) Int. Cl.[7] .............................. H01L 29/00
(52) U.S. Cl. ................. 257/503; 257/203; 257/207; 257/208; 257/459
(58) Field of Search ............... 257/203, 208, 257/207, 459, 503

(56) References Cited

U.S. PATENT DOCUMENTS 4,746,966 A * 5/1988 Fitzgerald et al. .......... 257/203
5,534,726 A * 7/1996 Ohoka ..................... 257/489

FOREIGN PATENT DOCUMENTS

| JP | 5-226339 | | 9/1993 | | |
|---|---|---|---|---|---|
| JP | 05226339 A | * | 9/1993 | ....... | H01L/21/3205 |

OTHER PUBLICATIONS

English translation, Notice to Submit Response, Korean App. 99-8765, Feb. 12, 2001.

* cited by examiner

*Primary Examiner*—Nathan Flynn
*Assistant Examiner*—Scott R. Wilson
(74) *Attorney, Agent, or Firm*—Myers Bigel Sibley & Sajovec

(57) ABSTRACT

Integrated circuit devices are provided in which short circuits can be prevented between pads on the surface of an integrated circuit substrate and a first dummy pattern on the surface that is spaced apart from and surrounds the pads, while still allowing planarity of a dielectric layer that is subsequently formed thereon to be retained. A second dummy pattern is provided on the surface between the pads and the first dummy pattern, which is spaced apart from the pads and from the first dummy pattern, and that surrounds the pads. The second dummy pattern preferably comprises rings on the surface, a respective one of which is between a respective one of the pads and the first dummy pattern and surrounds the respective one of the pads. The rings may be of circular, polygonal and/or other shape. In other embodiments, the second dummy pattern includes concentric dummy subpatterns or subrings on the surface between the pads and the first dummy patterns, that are spaced apart from the pads, from one another and from the first dummy pattern, and that surround the pads.

20 Claims, 3 Drawing Sheets

INTEGRATED CIRCUIT DEVICE INCLUDING DUMMY PATTERNS SURROUNDING PADS

FIELD OF THE INVENTION

This invention relates to integrated circuit devices, and more particularly to pads for integrated circuit devices.

BACKGROUND OF THE INVENTION

As integrated circuit devices become more highly integrated, it may become increasingly important to planarize the interlayer dielectric layers thereof. As is well known to those having skill in the art, integrated circuit devices generally include multiple levels of conductive wiring layers, for example, metallization, that are separated by interlayer dielectric layers. As the number of wiring layers and/or the density thereof continue to increase, it may become increasingly difficult to planarize the interlayer dielectric layers. As is well known to those having skill in the art, when the interlayer dielectric layers become nonplanar, it may be difficult to form subsequent wiring layers thereon, because the depth of focus may vary during photolithography. In a worst case scenario, portions of the wiring pattern may be open circuited and/or adjacent portions may be short circuited. As is also well known to those having skill in the art, planarization of the interlayer dielectric layer may take place using thermal reflow, chemical mechanical polishing and/or other conventional planarization techniques.

It also is known that planarization may be greatly affected by the pattern density of an underlying wiring layer. Accordingly, it is known to add a dummy pattern between the real patterns of an underlying wiring layer in order to make the pattern density more uniform.

FIGS. 1–3 illustrate an embodiment of an integrated circuit device in which dummy patterns have been added to make a wiring layer more uniform. In particular, FIG. 1 is a top view of an integrated circuit device in which a dummy pattern is formed between a real pattern and a pad. FIG. 2 is a cross-sectional view taken along the line II—II of FIG. 1. FIG. 3 is an enlarged top view of FIG. 1, illustrating bridges that may be generated between the dummy pattern and the pads, thereby causing a short circuit.

More specifically, as shown in FIGS. 1 and 2, a real pattern 1 is formed from a conductive layer, such as a metal layer, on a surface of an integrated circuit substrate, such as a semiconductor substrate 10 that includes one or more dielectric layers thereon. Pads 3 also are formed from the conductive layer. A dummy pattern 5 also is formed between the pads 3 and the real pattern 1, in order to make the pattern density more uniform. A plurality of apertures 7 also may be formed in the dummy pattern 5 in order to reduce stress therein. A plurality of grooves 9 also is formed between the real pattern 1 and the dummy pattern 5, and between the pads 3 and the dummy pattern 5. The groove 9 can prevent formation of bridges between the real pattern 1 and the dummy pattern 5, and between the pads 3 and the dummy pattern 5.

Unfortunately, as shown in FIG. 3, notwithstanding the provision of the grooves 9, a short circuit may be generated between a pad 3 and a second pad 3' due to bridges 11 that are formed between the pad 3 and the dummy pattern 5, and the second pad 3' and the dummy pattern 5. These bridges may be formed during electrical tests after forming the real pattern 1 and the pads 3. In order to solve this problem, the distance between a pad 3 and the dummy pattern 5 may be increased, for example, by increasing the size of the grooves 9. Unfortunately, when the grooves 9 are increased in size, planarization may be adversely impacted.

SUMMARY OF THE INVENTION

The present invention can prevent short circuits between a plurality of pads on the surface of an integrated circuit substrate and a first dummy pattern on the surface that is spaced apart from and surrounds the plurality of pads, while still allowing planarity of a dielectric layer that is subsequently formed thereon to be retained. In preferred embodiments, a second dummy pattern is provided on the surface between the plurality of pads and the first dummy pattern, which is spaced apart from the plurality of pads and from the first dummy pattern, and that surrounds the plurality of pads. The second dummy pattern preferably comprises a plurality of rings on the surface, a respective one of which is between a respective one of the plurality of pads and the first dummy pattern and surrounds the respective one of the plurality of pads. The rings may be of circular, polygonal and/or other shape. By providing the second dummy pattern, it is possible to prevent short circuits between the pads and the first dummy patterns because the second dummy pattern allows the first dummy pattern to be spaced further apart from the plurality of pads. Moreover, by interposing the second dummy pattern between the plurality of pads and the first dummy pattern, planarity of subsequently formed dielectric layers still can be maintained.

In other embodiments of the present invention, the second dummy pattern comprises a plurality of concentric dummy subpatterns, such as subrings, on the surface between the plurality of pads and the first dummy patterns, that are spaced apart from the plurality of pads, from one another and from the first dummy pattern, and that surround the plurality of pads. A real pattern also may be provided on the surface, wherein the first dummy pattern is spaced apart from and surrounds the real pattern.

In preferred embodiments, the second dummy pattern is spaced apart from the plurality of pads and from the first dummy pattern by distances that are between about 0.5 µm and about 10 µm. In other embodiments, a first groove pattern also may be included between the plurality of pads and the second dummy pattern and a second groove pattern also may be included between the second dummy pattern and the first dummy pattern. Accordingly, short circuits may be prevented between the plurality of pads and the first dummy pattern, while retaining planarity.

DETAILED DESCRIPTION OF PREFERRED EMBODIMENTS

Figure 1:
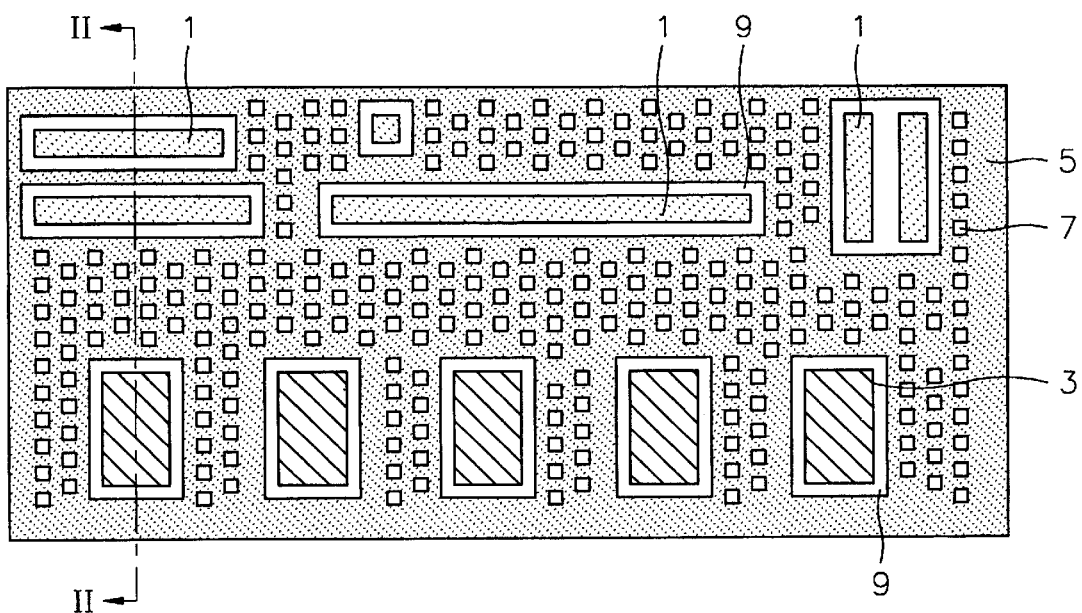
FIG. 1 is a top view of a conventional integrated circuit device including a dummy pattern between a real pattern and pads.
Figure 2:
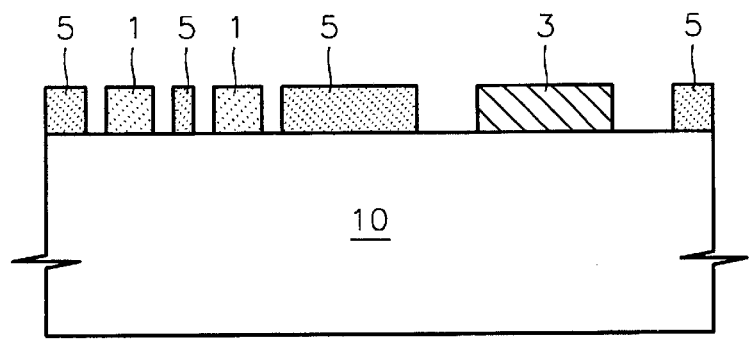
FIG. 2 is a cross-sectional view taken along the line II—II of FIG. 1.
Figure 3:
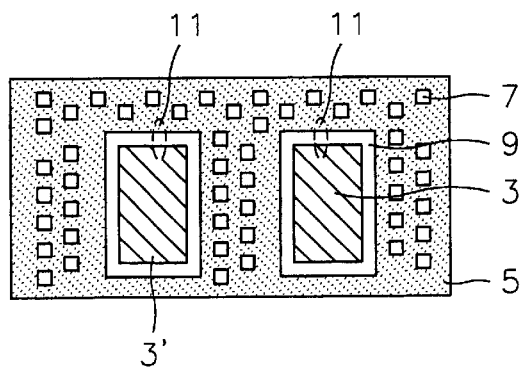
FIG. 3 is an enlarged top view illustrating the formation of bridges in a conventional integrated circuit device of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 4:
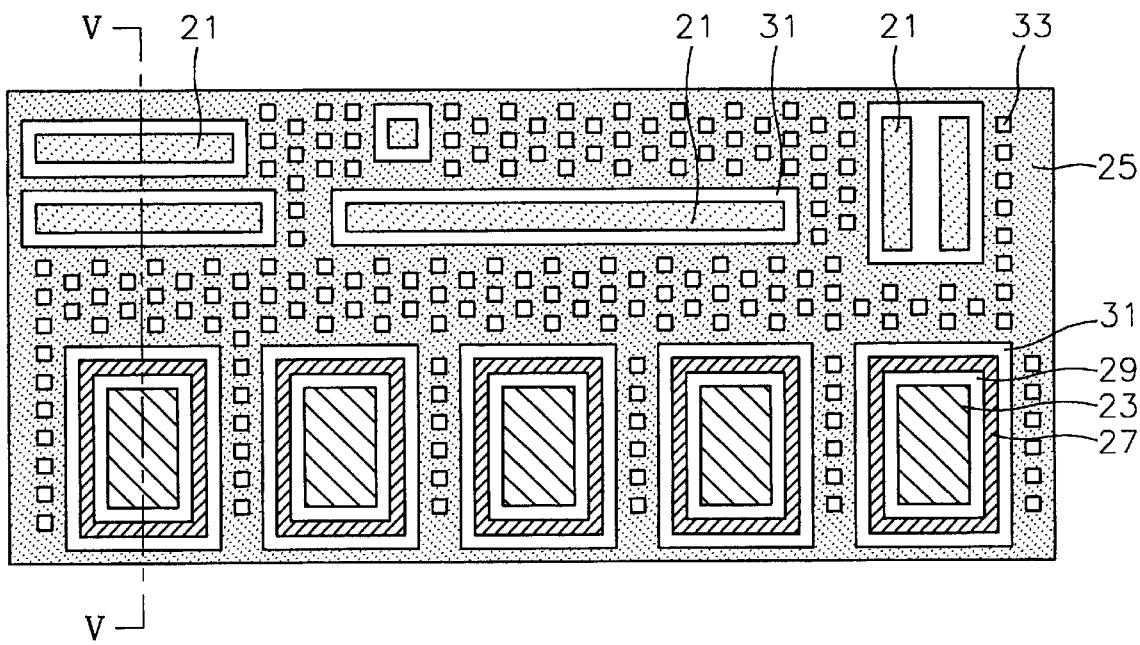
FIG. 4 is a top view of integrated circuit devices according to first embodiments of the present invention.
Figure 5:
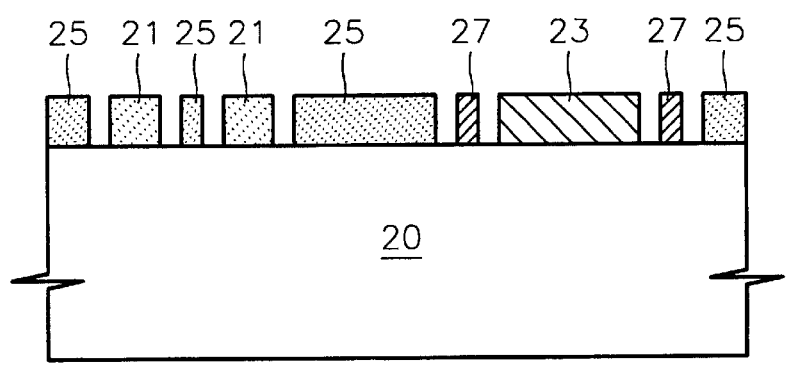
FIG. 5 is a cross-sectional view taken along the line V—V of FIG. 4.

Referring now to FIG. 4, a top view of first embodiments of integrated circuits according to the present invention is illustrated. FIG. 5 is a cross-sectional view taken along the line V—V of FIG. 4.

As shown in FIGS. 4 and 5, a real pattern 21 is formed from a patterned conductive layer such as a wiring layer, preferably a metal wiring layer. The real pattern 21 may have various shapes that are dictated by the functionality of the underlying integrated circuit in an integrated circuit substrate 20, such as a silicon semiconductor substrate. The integrated circuit substrate 20 also may include one or more interlayer dielectric layers that space the real pattern from one or more underlying conductive layers. A plurality of pads 23 also are provided, preferably from the same patterned conductive layer as the real pattern 21, on the surface of the integrated circuit substrate. A first dummy pattern 25 also is provided, also preferably from the patterned conductive layer. The first dummy pattern 25 preferably covers the entire integrated circuit substrate surface, except for the real patterns 21 and the pads 23.

According to embodiments of the invention, a second dummy pattern 27 is formed on the surface between the plurality of pads 23 and the first dummy pattern 25, preferably from the same patterned conductive layer. The second dummy pattern 27 is spaced apart from the plurality of pads 23 and from the first dummy pattern 25 and surrounds the plurality of pads 23. Preferably, the second dummy pattern 27 comprises a plurality of rings on the surface, a respective one of which is between a respective one of the plurality of pads 23 and the first dummy pattern 25, and surrounding the respective one of a plurality of pads 23. The rings may be of circular (including elliptical), polygonal (including square or rectangular) and/or other shapes.

Figure 6:
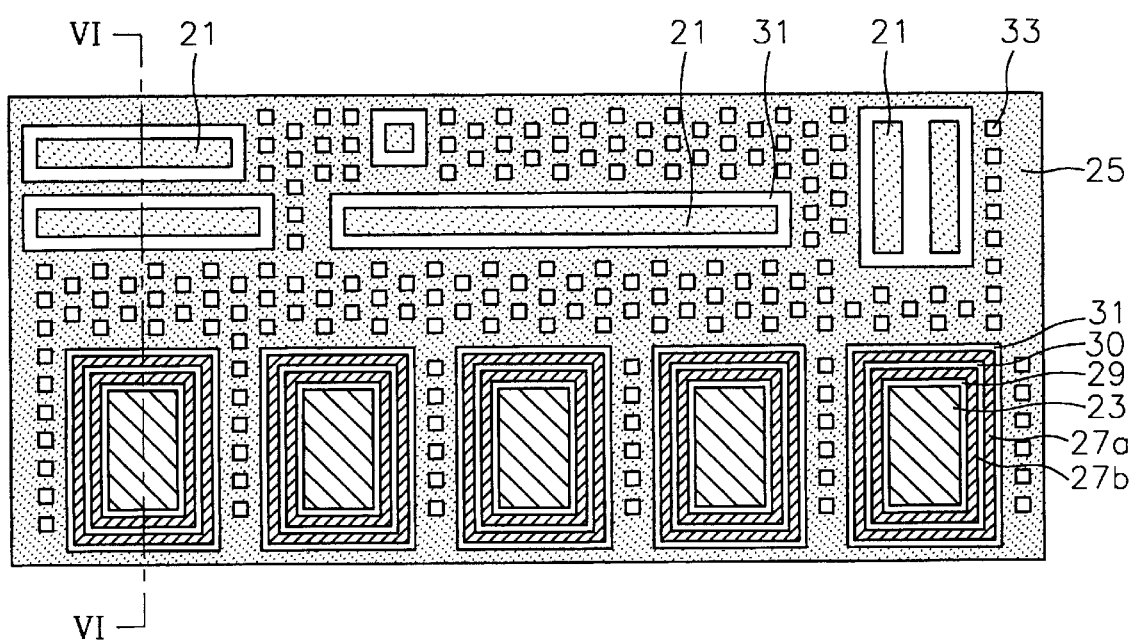
FIG. 6 is a top view of integrated circuit devices according to second embodiments of the present invention.
Figure 7:
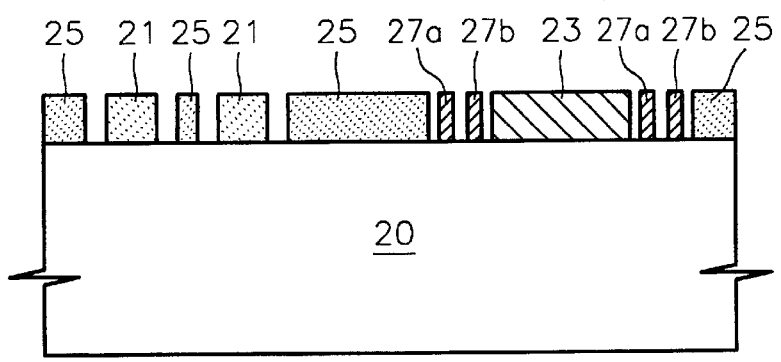
FIG. 7 is a cross-sectional view taken along the line VI—VI of FIG. 6.

In the embodiments of FIGS. 4 and 5, a single dummy pattern 27 is formed. However, as shown in FIGS. 6 and 7, the dummy pattern 27 may comprise a plurality of concentric dummy subpatterns, such as concentric subrings 27a and 27b, on the surface between the plurality of pads 23 and the first dummy pattern 25. The concentric subrings 27a and 27b are spaced apart from the plurality of pads 23, from one another, and from the first dummy pattern 25, and surround the plurality of pads 23. Although only two concentric dummy subpatterns are shown in FIGS. 6 and 7, more than two dummy subpatterns, such as more than two dummy subrings, may be provided.

Referring again to FIG. 4, the second dummy pattern 27 in the illustrated embodiments surround each of the pads 23 and is separated by a predetermined distance, for example between about 0.5 μm and about 10 μm by a first groove pattern 29. The first groove pattern 29 can prevent bridging from occurring between the pads 23 and the second dummy pattern 27. Moreover, the first dummy pattern 25 preferably is separated from the second dummy pattern 27 by a predetermined distance, for example between about 0.5 μm and about 10 μm, by a second groove pattern 31. The first dummy pattern 25 also may be separated from the real pattern 21 by a predetermined distance, for example between about 0.5 μm and about 10 μm. The second groove pattern 31 can prevent bridging from occurring between the real pattern 21 and the first dummy pattern 25, and can prevent bridging from occurring between the first dummy pattern 25 and the second dummy pattern 27. An array of apertures 33 also may be formed in the first dummy pattern 25 to relax stress therein.

Referring to FIGS. 6 and 7, the first groove pattern 29 and the second groove pattern 31 also may be provided and may have dimensions that were described above with reference to the groove patterns 29, 31 of FIGS. 4 and 5. A third groove pattern 30 also may be provided between the adjacent concentric dummy subrings 27a and 27b. This third groove pattern 30 may separate the first and second concentric dummy subrings 27a and 27b from one another by a predetermined distance, for example between about 0.5 μm and about 10 μm. Additional grooves also may be formed if additional concentric dummy subpatterns also are formed.

As shown in FIGS. 4–7, in embodiments of integrated circuits according to the present invention, the second dummy pattern 27, including but not limited to one or more dummy subrings 27a and 27b, may be electrically insulated by a first, second and/or third groove pattern 29, 31 and/or 30, and may be formed around the pads 23 in a manner which may prevent short circuits between the pads 23 and the first dummy pattern 25, while allowing planarity of a subsequently formed dielectric layer to be retained. Accordingly, although short circuits may be formed due to bridges between the pads 23 and the second dummy pattern 27, or second dummy subrings 27a/27b, the performance of the integrated circuit device need not be degraded, as the first dummy pattern 25 is separated from the pad 23 by the second groove pattern 31. Thus, although bridging may occur between the pads 23 and the second dummy pattern 27, or subrings 27a/27b, this bridging generally will not bridge all the way across to the first dummy pattern 25. The first dummy pattern 25 therefore can remain insulated from the pads 23. Moreover, by providing the second dummy pattern 27 or second dummy subrings 27a/27b, planarity may be retained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   an integrated circuit substrate including a surface;
   a plurality of pads on the surface;
   a first dummy pattern on the surface that is spaced apart from and surrounds the plurality of pads; and
   a second dummy pattern on the surface between the plurality of pads and the first dummy pattern, which is spaced apart from the plurality of pads and from the first dummy pattern, and that surrounds the plurality of pads.

2. An integrated circuit comprising:
an integrated circuit substrate including a surface;
a plurality of pads on the surface;
a first dummy pattern on the surface that is spaced apart from and surrounds the plurality of pads; and
a second dummy pattern on the surface between the plurality of pads and the first dummy pattern, which is spaced apart from the plurality of pads and from the first dummy pattern, and that surrounds the plurality of pads; and
wherein the first dummy pattern is on the entire surface except for the plurality of pads and the second dummy pattern.

3. An integrated circuit comprsing:
an integrated circuit substrate including a surface;
a plurality of pads on the surface;
a first dummy pattern on the surface that is spaced apart from and surrounds the plurality of pads;
a second dummy pattern on the surface between the plurality of pads and the first dummy pattern, which is spaced apart from the plurality of pads and from the first dummy pattern, and that surrounds the plurality of pads; and
a real pattern on the surface, wherein the first dummy pattern is spaced apart from and surrounds the real pattern.

4. An integrated circuit according to claim 1 wherein the second dummy pattern comprises a plurality of rings on the surface, a respective one of which is between a respective one of the plurality of pads and the first dummy pattern and surrounds the respective one of the plurality of pads.

5. An integrated circuit according to claim 4 wherein the plurality of rings are circular or polygonal in shape.

6. An integrated circuit comprising:
an integrated circuit substrate including a surface;
a plurality of pads on the surface;
a first dummy pattern on the surface that is spaced apart from and surrounds the plurality of pads;
a second dummy pattern on the surface between the plurality of pads and the first dummy pattern, which is spaced apart from the plurality of pads and from the first dummy pattern, and that surrounds the plurality of pads; and
a first groove pattern between the plurality of pads and the second dummy pattern and a second groove pattern between the second dummy pattern and the first dummy pattern.

7. An integrated circuit according to claim 1 wherein the second dummy pattern comprises a plurality of concentric dummy subpatterns on the surface between respective ones of the plurality of pads and the first dummy pattern, which are spaced apart from the plurality of pads, from one another and from the first dummy pattern, and that surround the plurality of pads.

8. An integrated circuit comprising:
an integrated circuit substrate including a surface;
a plurality of pads on the surface;
a first dummy pattern on the surface that is spaced apart from and surrounds the plurality of pads; and
a second dummy pattern on the surface between the plurality of pads and the first dummy pattern, which is spaced apart from the plurality of pads and from the first dummy pattern, and that surrounds the plurality of pads;
wherein the second dummy pattern is spaced apart from the plurality of pads and from the first dummy pattern by distances that are between about 0.5 $\mu$m and about 10 $\mu$m.

9. An integrated circuit comprising:
an integrated circuit substrate including a surface;
a plurality of pads on the surface;
a pattern on the surface that is spaced apart from and surrounds the plurality of pads; and
a plurality of rings on the surface, a respective one of which is between and spaced apart from a respective one of the plurality of pads and the pattern, and surrounds the respective one of the plurality of pads.

10. An integrated circuit comprising:
an integrated circuit substrate including a surface;
a plurality of pads on the surface;
a pattern on the surface that is spaced apart from and surrounds the plurality of pads; and
a plurality of rings on the surface, a respective one of which is between and spaced apart from a respective one of the plurality of pads and the pattern, and surrounds the respective one of the plurality of pads;
wherein the pattern is on the entire surface except for the plurality of pads and the plurality of rings.

11. An integrated circuit comprising:
an integrated circuit substrate including a surface;
a plurality of pads on the surface;
a pattern on the surface that is spaced apart from and surrounds the plurality of pads;
a plurality of rings on the surface, a respective one of which is between and spaced apart from a respective one of the plurality of pads and the pattern, and surrounds the respective one of the plurality of pads; and
a real pattern on the surface, wherein the pattern is spaced apart from and surrounds the real pattern.

12. An integrated circuit according to claim 9 wherein the plurality of rings are circular or polygonal in shape.

13. An integrated circuit comprising:
an integrated circuit substrate including a surface;
a plurality of pads on the surface;
a pattern on the surface that is spaced apart from and surrounds the plurality of pads;
a plurality of rings on the surface, a respective one of which is between and spaced apart from a respective one of the plurality of pads and the pattern, and surrounds the respective one of the plurality of pads; and
a first groove pattern between the plurality of pads and the plurality of rings and a second groove pattern between the plurality of rings and the pattern.

14. An integrated circuit according to claim 9 wherein the plurality of rings comprises a plurality of concentric sub-rings on the surface between the plurality of pads and the pattern, that are spaced apart from the plurality of pads, from one another and from the pattern, and that surround the plurality of pads.

15. An integrated circuit comprising:
an integrated circuit substrate including a surface;
a plurality of pads on the surface;
a pattern on the surface that is spaced apart from and surrounds the plurality of pads; and
a plurality of rings on the surface, a respective one of which is between and spaced apart from a respective one of the plurality of pads and the pattern, and surrounds the respective one of the plurality of pads;

wherein the plurality of rings are spaced apart from the plurality of pads and from the pattern by distances that are between about 0.5 $\mu$m and about 10 $\mu$m.

16. An integrated circuit comprising:

an integrated circuit substrate including a surface;

a plurality of pads on the surface;

a pattern on the surface that is spaced apart from and surrounds the plurality of pads; and means for preventing short circuits between the plurality of pads and the pattern while allowing planarity of a dielectric layer that is subsequently formed thereon to be retained.

17. An integrated circuit comprising:

an integrated circuit substrate including a surface;

a plurality of pads on the surface;

a pattern on the surface that is spaced apart from and surrounds the plurality of pads; and means for preventing short circuits between the plurality of pads and the pattern while allowing planarity of a dielectric layer that is subsequently formed thereon to be retained;

wherein the pattern is on the entire surface except for the plurality of pads and the means for preventing.

18. An integrated circuit according to claim 16 wherein the means for preventing comprises a plurality of rings on the surface, a respective one of which is between a respective one of the plurality of pads and the pattern, surrounding the respective one of the plurality of pads.

19. An integrated circuit according to claim 18 wherein the plurality of rings are circular or polygonal in shape.

20. An integrated circuit according to claim 18 wherein the plurality of rings comprises a plurality of concentric subrings on the surface between the plurality of pads and the pattern, that are spaced apart from the plurality of pads, from one another and from the pattern, and that surround the plurality of pads.

* * * * *